United States Patent

Shimokura et al.

Patent Number: 5,305,283
Date of Patent: Apr. 19, 1994

[54] DRAM COLUMN ADDRESS LATCHING TECHNIQUE

[75] Inventors: Gregg M. Shimokura, Ottawa; Peter B. Gillingham, Kanata, both of Canada

[73] Assignee: Mosaid, Inc., Kanata, Canada

[21] Appl. No.: 680,993

[22] Filed: Apr. 5, 1991

[51] Int. Cl.$^5$ .................................................. G11C 8/00
[52] U.S. Cl. ............................ 365/230.08; 365/233.5
[58] Field of Search ..................... 365/230.08, 233.05

[56] References Cited

U.S. PATENT DOCUMENTS

| | | | |
|---|---|---|---|
| 4,242,738 | 12/1980 | Dingwall | 365/233.5 |
| 4,633,442 | 12/1986 | Borghese | 365/233.5 |
| 5,036,495 | 7/1991 | Busch et al. | 365/233.5 |
| 5,077,690 | 12/1991 | Smith | 365/230.08 |
| 5,083,296 | 1/1992 | Hara et al. | 365/230.08 |
| 5,148,535 | 9/1992 | Ballard | 365/230.08 |

Primary Examiner—William L. Sikes
Assistant Examiner—Trong Phan
Attorney, Agent, or Firm—Antonelli, Terry, Stout & Kraus

[57] ABSTRACT

Apparatus and a method for latching a column address in a DRAM, having increased speed and no race conditions. The method is comprised of the steps of receiving column select and column address input signals, enabling detection and indication, by generation of an indication signal, of the presence of each stable column address input signal upon the presence of a column select signal, summing the indication signals, and operating a latch by each of the column address input signals whereby a DRAM column can be addressed upon enabling by the summed indication signals, whereby the latching is not enabled without a first indication of the presence of a stable column address and whereby the first indication is prevented without the earlier presence of a column select signal.

4 Claims, 2 Drawing Sheets

DRAM COLUMN ADDRESS LATCHING TECHNIQUE

FIELD OF THE INVENTION

This invention relates to semiconductor memories, and in particular to a method and apparatus for latching the column address in a dynamic random access (DRAM) memory.

BACKGROUND TO THE INVENTION

DRAMs are comprised of word lines (rows) and bit lines (columns), and bit charge retaining cells adjacent the intersections of the rows and columns. By addressing a row and a column, a memory cell can be read or written to. The present invention concerns the circuitry used to address a column.

Typically a read cycle of the DRAM involves charging a bit line to one-half logic level, dumping the charge stored in a memory cell on the bit line, sensing the charge on the bit line raising it to full logic level and restoring the memory cell, and connecting the bit line carrying full logic level to a data bus. The internal column cycle is usually started by detecting the presence of a stable column address in an address transition detection ATD circuit.

DESCRIPTION OF THE PRIOR ART

In DRAM column address circuitry, particularly using a fast page mode or static column mode, ATD circuits are used to start internal column cycles. In DRAM, using static column mode, a stable address triggers a sequence of events which results in the completion of a read cycle. In a fast page mode DRAM, a stable address triggers a sequence of events which results in the completion of a read cycle resulting in data waiting at an internal data output buffer until the falling edge of a column select (/CAS) signal, when the read data is applied to the output pin. In either case address transition detection provides the indication of the presence of a stable column address, and is used to complete the internal memory cycle. Only the final step of enabling a data output buffer is controlled by the /CAS signal, in a DRAM using fast page mode.

In DRAM circuits, the address transition detection circuits and column address latches are separately controlled. Latches receiving the column addresses receive the signals which propagate freely to internal circuitry until the falling edge of the /CAS signal. ATD circuitry must quickly disable ongoing column cycles before a new address can propagate through an address decoder. Thus it is necessary for the ATD circuitry to be faster than the address decoders; the need to have a slower address path essentially limits address time of the memory data.

In addition, because the ATD circuitry operates separately from the address decoding and latching path, race conditions exist. If an address transition occurs close to the time of the falling edge of the /CAS signal, one of two problems arise. If the address transition detector is disabled before the address latch, no column cycle for the new address is created. The new address is then only used for data output path multiplexing, and incorrect data is read. The other problem occurs when column address inputs change too late to be latched, but still trigger the transition detector and a new column cycle. The result is unnecessary delay of the data output.

SUMMARY OF THE INVENTION

The present invention substantially eliminates the aforenoted problems. In the fast page mode, the ATD circuitry is disabled on the falling edge of /CAS, which in turn prevents new addresses from being latched. This solves the problem of having a fast ATD path and a slow address path because address latch enable and column cycle disable functions are controlled by the same signal. Operation is more consistent since any address transition that activates the ATD is also latched.

Since there is no need to slow down the column address signal path to ensure correct operation, the memory addressing speed is increased. Because there is no race between the ATD disable and address latch disable signals on the falling edge of the /CAS signal, the circuit has significantly increased reliability.

Consistent response to column address inputs is achieved by controlling the column address latches with the summed ATD (address present) signal.

In accordance with an embodiment of the invention, a method of addressing columns in a dynamic random access memory (DRAM) is comprised of the steps of receiving column select and column address input signals, enabling detection and indication, by generation of an indication signal, of the presence of each stable column address input signal upon the presence of a column select signal, summing the indication signals, enabling a corresponding latch by each of the in dication signals to latch corresponding ones of the column address input signals addressing a DRAM column using the latched address input signals upon enabling of a column decode control by the summed indication signals, whereby said latching is not enabled without a first indication of the presence of a stable column address and whereby the first indication is prevented without the earlier presence of a column select signal.

In accordance with another embodiment, a dynamic random access memory (DRAM) having row lines (rows) and column lines (columns), memory cells associated with the rows and columns, and apparatus for addressing the columns, is comprised of apparatus for receiving DRAM column select and column address input signals, apparatus for enabling detection and indication, by generating an indication signal, of the presence of each stable column address input signal, upon the presence of a column address signal, apparatus for summing the indication signal, and apparatus for latching each of the column address input signals whereby a DRAM column can be addressed upon enabling by the summed indication signals.

In accordance with another embodiment, a dynamic random access memory (DRAM) having row lines (rows) and column lines (columns), memory cells associated with the rows and columns, and apparatus for addressing the columns whereby at least one memory cell of a row of memory cells can be read or written, is comprised of column address signal inputs, column address latches each connected to one of the inputs for receiving column address signals and outputting a column enable signal, address transition detection circuits each having an input connected to one of the inputs for receiving the column address signals, for detecting stable address signal inputs and outputting stable address present confirmation (ATD) signals, a chip select (/CAS) signal input connected to enable inputs of each of the address transition detection circuits, an AND gate having inputs connected to the outputs of the address transition detection circuits for receiving the ATD signals, and enable inputs of each of the latches connected to an output of a corresponding column address detection circuit, whereby upon receipt of a new column address input signal, latching thereof into a corresponding column address latch is not enabled to store the new column address input signal until a /CAS signal has changed to a level enabling the address transition detection circuitry to receive and detect the new address input signal.

BRIEF INTRODUCTION TO THE DRAWINGS

A better understanding of the invention will be obtained by reference to the detailed description below, in conjunction with the following drawings, in which.

DETAILED DESCRIPTION OF THE INVENTION

Figure 1:
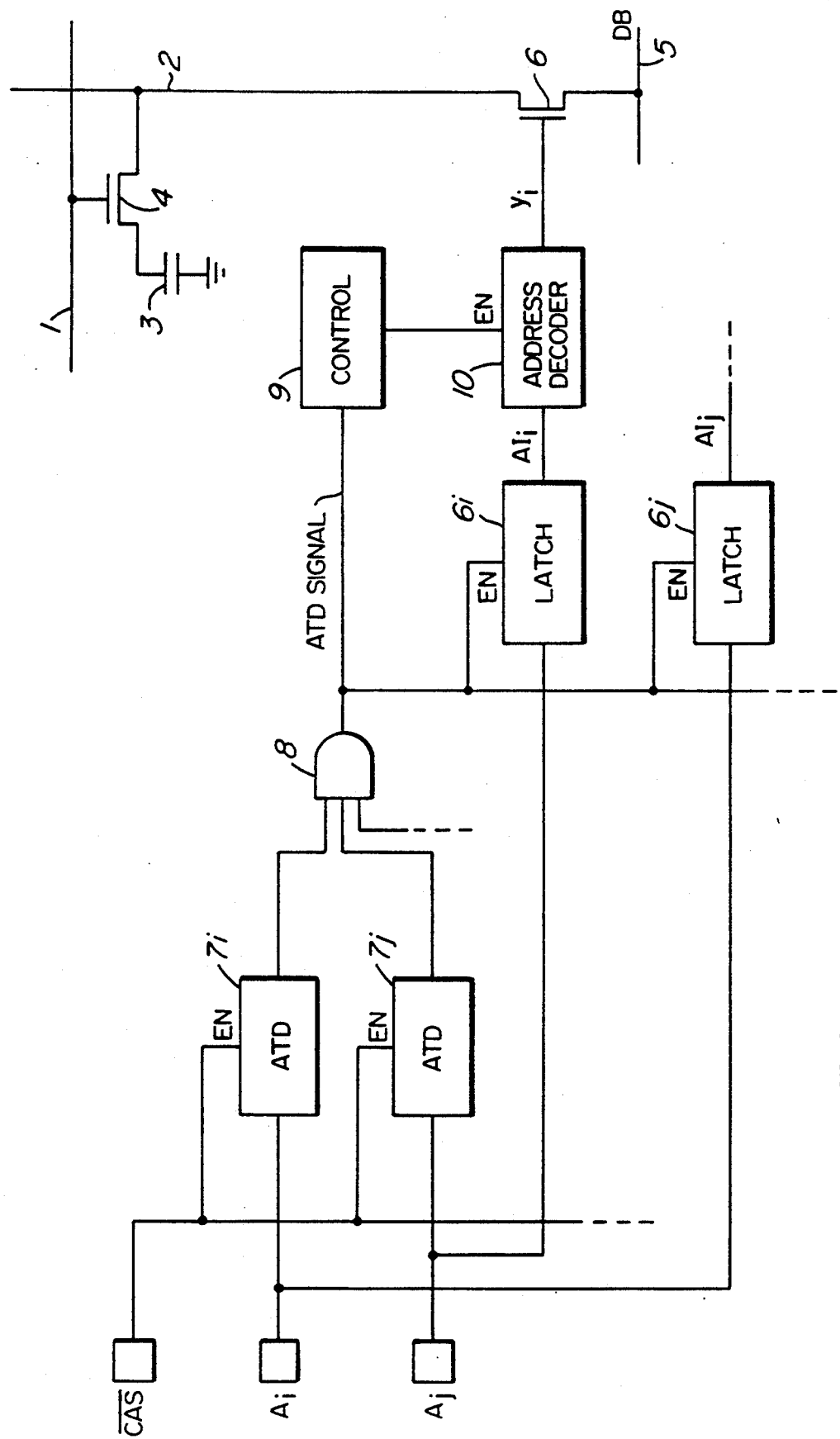
FIG. 1 is a block diagram of an embodiment of the present invention.

FIG. 1 illustrates a word line 1 and a bit line 2 in an array of word lines and bit lines in a dynamic random access memory (DRAM) of well known construction. Adjacent each word line and bit line intersection is a memory cell comprised of a bit storage charging capacitor 3 which is in series with the source-drain circuit of a field effect transistor 4. The gate of transistor 4 is connected to the word line.

The bit line 2 is connected to a data bus 5 through the source-drain circuit of an access field effect transistor 6, whose gate is labelled $y_i$.

Also associated with the bit line is precharge circuitry, sensing circuitry, etc., not shown. The bit line and its associated circuitry is referred to below alternatively as a column line or column. Operation of the memory to transfer charge to a bit line and to establish full logic level thereon is well known.

In the present invention, in a typical cycle to read the logic level on the bit line 2, a logic signal is applied to the gate of transistor 6, which conducts, transferring the logic level on the bit line to the data bus 5. The signals on leads $y_i \ldots y_j$ are provided by logic levels at the outputs of Y address decoders 10, which have their inputs connected to the outputs of latches $6_i \ldots 6_j$. These signals are produced upon receipt of address signals from address inputs $A_i \ldots A_j$. Latching of the address inputs to latches $6_i \ldots 6_j$ is enabled upon receipt of an enable signal at enable (EN) inputs of latches $6_i \ldots 6_j$.

The address input signals $A_i \ldots A_j$ are also applied to the inputs of address transition detection circuits $7_i$–$7_j$. An ATD circuit will be found in a paper entitled "Two 13-ns 64 K CMOS SRAM'S With Very Low Active Power and Improved Asynchronous Circuit Techniques", by Stephen T. Flannigan et al, in the IEEE Journal of Solid-State Circuits, vol. SC-21, No. 5, October 1986, pp. 692–703. However other ATD circuits are known. An ATD circuit detects the presence of a stable address.

Enable (EN) inputs of the ATD circuits $7_i \ldots 7_j$ are connected to an /CAS (column select) input the signal of which is provided by a microprocessor operating the memory, in a well known manner. This input signal indicates that a column select cycle should begin. A high logic level /CAS signal enables the ATD circuit to operate.

The outputs of the ATD circuits are connected to the inputs of an AND gate 8. The output of the AND gate is connected to the enable inputs of latches $6_i \ldots 6_j$, and also to the input of a control circuit circuit 9 for a Y address decoder 10. The output of control 9 is connected to the enable EN inputs of address decoders 10, for enabling or disabling column decoding.

In operation, a column select high level signal is received on the /CAS input, enabling the ATD circuits. An address $A_i$, $A_j$ is received, which is presented to one of the inputs of an ATD circuit $7_i \ldots 7_j$, and to the inputs of latches $6_i \ldots 6_j$. Since an ATD circuit has been enabled, it detects the presence of a stable address, and provides a logic signal to the input of AND gate 8. This causes an enable signal to be applied to the latches $6_i \ldots 6_j$, allowing whichever has received an address input to latch and outputting an enable signal to the gate of transistor 6, enabling of transistor 6 and the resulting reading or writing of a bit line to the data bus 5.

However, at the falling edge of /CAS, the ATD circuits $7_i \ldots 7_j$, are inhibited. The ATD circuits will thus not indicate the presence of address signals, inhibiting the latches $6_i \ldots 6_j$. This prevents new addresses from being latched.

As a result the race conditions are eliminated. A slow address path is not required because the address latch enable and the column cycle disable (the output signal of NAND gate which controls the column cycle) are controlled by the same signal. Rather than having two paths, an ATD column address disable/enable path and a separate column address path, and the requirement of a slow address path, the two paths are locked together with controlled timing. A speeded up address path without uncertainties caused by race conditions is thus achieved.

Figure 2:
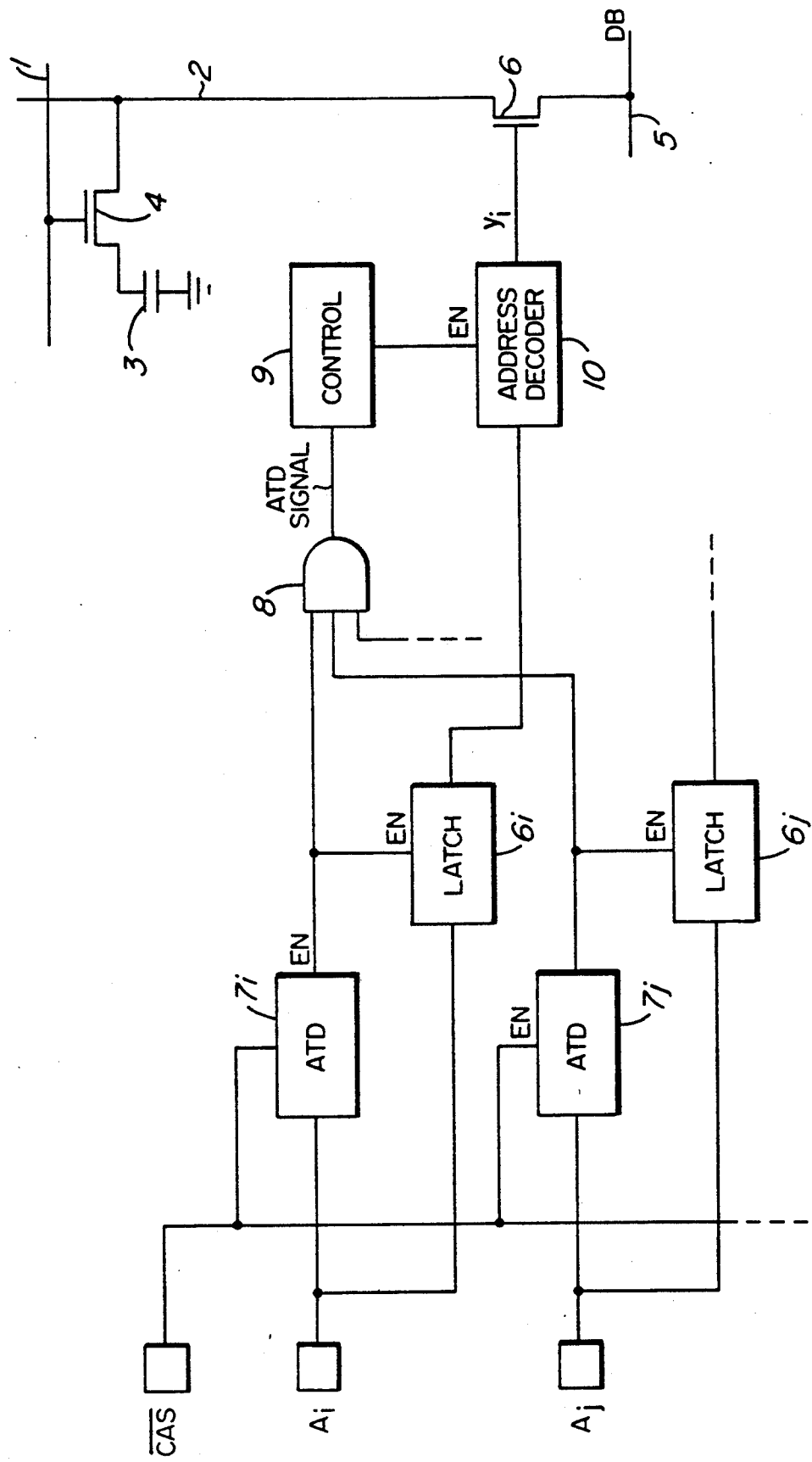
FIG. 2 is a block diagram of another embodiment of the present invention.

FIG. 2 illustrates another embodiment of the invention. The ATD circuits are connected to the /CAS, $A_i$ and $A_j$ inputs as with the embodiment of FIG. 1, and the inputs to latches $6_i$ and $6_j$ are similarly connected to the address inputs $A_i$ and $A_j$. However in this case each latch is enabled from the output of a corresponding ATD circuit, rather than from the output of AND gate 8 as in the embodiment of FIG. 1. The outputs of the ATD circuits $7_i$ and $7_j$ are connected to the inputs of AND gate 15, the output of which is connected to the input of control 9, as in the embodiment of FIG. 1.

The output of each latch is connected to the input of $A_y$ address decoder 10, and the output of control 9 is connected to the enable EN input of address decoder 10. The remaining elements 1–3, 5 and 6 are the same as in the embodiment of FIG. 1.

In this case, the local ATD signal enables the corresponding latch. The summed output signal of the ATD circuits are used in this embodiment only as a column cycle control signal, rather than an enable signal as in the embodiment of FIG. 1. This circuit improves column address set up time.

A person understanding this invention may now conceive of alternative structures and embodiments or variations of the above. All of those which fall within the scope of the claims appended hereto are considered to be part of the present invention.

We claim:

1. A dynamic random access memory (DRAM) having row lines (rows) and column lines (columns), memory cells associated with the rows and columns, and means for addressing the columns comprising:

(a) means for receiving DRAM column select and column address input signals, (b) means for enabling detection and indication, by generating an indication signal, of the presence of each column address input signal, in the presence of a column select signal, (c) means for logically ANDing said indication signals to provide logic signals, and (d) means for latching each of said column address input signals by said logic signals whereby a DRAM column can be addressed upon enabling by said logic signals.

2. A dynamic random access memory (DRAM) having row lines (rows) and column lines (columns), memory cells associated with the rows and columns, and means for addressing the columns whereby at least one memory cell of a row of memory cells can be read or written, comprising:

(a) column address signal inputs, (b) column address latches each connected to one of said inputs for receiving column address signals and outputting a column enable signal, (c) address transition detection circuits each having an input connected to one of said inputs for receiving said column address signals, for detecting address signal inputs and outputting "address present" confirmation (ATD) signals, (d) a chip select (/CAS) signal input connected to enable inputs of each of said address transition detection circuits, and (e) an AND gate having inputs connected to the outputs of said address transition detection circuits for receiving said ATD signals and having an output connected to enable inputs of said latches, whereby upon receipt of a new column address input signal, latching thereof into a corresponding column address latch is not enabled to store said new column address input signal until a /CAS signal has charged to a level enabling said address transition detection circuitry to receive and detect said new address input signal.

3. A method of addressing columns in a dynamic random access memory (DRAM) comprising the steps of:

(a) receiving column select and column address input signals, (b) enabling detection and indication by generation of an indication signal of the presence of each stable column address input signal, upon the presence of a column select signal, (c) summing said indication signals, (d) enabling a corresponding latch by each of said indication signals, to latch corresponding ones of said column address input signals, (e) addressing a DRAM column using said latched address input signals upon enabling of a column decode control by said summed indication signals, whereby said latching is not enabled without a first indication of the presence of a stable column address and whereby said first indication is prevented without the earlier presence of a column select signal.

4. A dynamic random access memory (DRAM) having row lines (rows) and column lines (columns), memory cells associated with the rows and columns, and means for addressing the columns whereby at least one memory cell of a row of memory cells can be read or written, comprising:

(a) column address signal inputs, (b) column address latches each connected to one of said inputs for receiving column address signals and outputting a column enable signal, (c) address transition detection circuits each having an input connected to one of said inputs for receiving said column address signals, for detecting address signal inputs and outputting "address present" confirmation (ATD) signals, (d) a chip select (/CAS) signal input connected to enable inputs of each of said address transition detection circuits, (e) an AND gate having inputs connected to the outputs of said address transition detection circuits for receiving said ATD signals, and (f) enable inputs of each of said latches connected to an output of a corresponding column address detection circuit, whereby upon receipt of a new column address input signal, latching thereof into a corresponding column address latch is not enabled to store said new column address input signal until a /CAS signal has changed to a level enabling said address transition detection circuitry to receive and detect said new address input signal.

* * * * *

UNITED STATES PATENT AND TRADEMARK OFFICE
CERTIFICATE OF CORRECTION

PATENT NO. : 5,305,283
APPLICATION NO. : 07/680993
DATED : April 19, 1994
INVENTOR(S) : Gregg M. Shimokura and Peter B. Gillingham Page 1 of 1

It is certified that error appears in the above-identified patent and that said Letters Patent is hereby corrected as shown below:

Title page item 30, add the following:

--Foreign Application Priority Data--

--April 5, 1991 [GB]   UK Intellectual Property Office   9107127.4--
--April 6, 1990 [GB]   UK Intellectual Property Office   9007795.9--

Signed and Sealed this

Second Day of December, 2008

JON W. DUDAS
*Director of the United States Patent and Trademark Office*